United States Patent
Chen

(10) Patent No.: US 7,141,275 B2
(45) Date of Patent: Nov. 28, 2006

(54) IMPRINTING LITHOGRAPHY USING THE LIQUID/SOLID TRANSITION OF METALS AND THEIR ALLOYS

(75) Inventor: Yong Chen, Sherman Oaks, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/870,664

(22) Filed: Jun. 16, 2004

(65) Prior Publication Data

US 2005/0282388 A1    Dec. 22, 2005

(51) Int. Cl.
    *H01L 1/04* (2006.01)
(52) U.S. Cl. .................. 427/458; 438/691; 438/700; 438/735
(58) Field of Classification Search ........ 427/458–460; 438/691–735
    See application file for complete search history.

(56) References Cited

U.S. PATENT DOCUMENTS

| 5,772,905 A * | 6/1998 | Chou .................. 216/44 |
| 6,048,623 A | 4/2000 | Everhart et al. |
| 6,165,911 A * | 12/2000 | Calveley .................. 438/754 |
| 6,432,740 B1 | 8/2002 | Chen |
| 6,518,156 B1 * | 2/2003 | Chen et al. .................. 438/597 |
| 6,680,214 B1 | 1/2004 | Tavkhelidze et al. |
| 2002/0093122 A1 | 7/2002 | Choi et al. |
| 2003/0215577 A1 * | 11/2003 | Wilson et al. .................. 427/458 |
| 2004/0150141 A1 * | 8/2004 | Chao et al. .................. 264/494 |
| 2005/0051698 A1 * | 3/2005 | Sreenivasan et al. ...... 249/135 |
| 2006/0014084 A1 * | 1/2006 | French et al. .................. 430/5 |

FOREIGN PATENT DOCUMENTS

| EP | 1008078 | 5/2000 |
| WO | WO99/64642 | 12/1999 |

OTHER PUBLICATIONS

C.J. Martin, Prediction of fabrication distortions in step and flash imprint lithography templates, vol. 20, No. 6, Nov./Dec. 2002, pp. 2891-2895.*
Price, D. "A New Method of Embossing Paper, Boards, Leather, Tin, and Like Substances" GB 17,969- Jun. 4, 1989.
Chou, S et al; "Imprint Lithography With 25-Nanometer Resolution" - Science vol. 272- Apr. 5, 1996- pp. 85-87.

* cited by examiner

Primary Examiner—Nathan W. Ha

(57) ABSTRACT

A method is provided for imprinting a pattern having nanoscale features from a mold into the patternable layer on a substrate. The method comprises: providing the mold; forming the patternable layer on the substrate; and imprinting the mold into the patternable layer, wherein the patternable layer comprises a metal or alloy having a transition temperature from its solid form to its liquid form that is within a range of at least 10° above room temperature.

14 Claims, 6 Drawing Sheets

IMPRINTING LITHOGRAPHY USING THE LIQUID/SOLID TRANSITION OF METALS AND THEIR ALLOYS

TECHNICAL FIELD

The present invention is directed to imprinting lithography, involving imprinting a mold into a mold-receiving layer at the nanoscale level, where the dimensions of critical features are measured in nanometers, and, more particularly, to the composition of the mold-receiving layer in which the mold pattern is imprinted.

BACKGROUND ART

It is advantageous to fabricate electronic circuits at the nanometer scale, because high density of circuit elements, high operating speed, and low process cost are realized. By "nanometer scale" is meant that the critical dimension of a feature is measured in nanometers. However, in nanoscale circuits, one major problem is how to fabricate nanoscale circuits efficiently.

To solve this problem, effective, low-cost methods for fabricating nanoscale circuits, employing imprinting lithography, have been developed. The imprinting process is described, for example, in U.S. Pat. No. 6,432,740, entitled "Fabrication of Molecular Electronic Circuit by Imprinting", issued on Aug. 13, 2002, to Yong Chen, the contents of which are incorporated herein by reference.

In the imprinting process, a mold with a protruding pattern is pressed into a thin polymer film. The protruding pattern in the mold creates a recess in the thin polymer film, and thus the polymer replicates the pattern on the mold. The mold is then removed from the film. The film then is processed such that the polymer in the recess area is removed, thereby exposing the underlying substrate.

To avoid the interaction between polymer and mold, a release layer is usually coated on the mold before imprinting. The release layer is usually a self-assembled molecular layer, which can effectively reduce the interaction between the mold and the polymer. However, it is very difficult to form a defect-free coating of the release layer on the mold surface, and defects will also invariably be created during imprinting, especially when the pattern is close to 10 nm or less. These defects cause the polymer to stick to the mold.

It is also difficult to maintain a high aspect ratio between the height and width of the polymer pattern due to the mechanical properties of the polymer, and the lift-off and anisotropic etching processes become very difficult or impossible when the polymer pattern is very thin.

Thus, there is a need for a method of replicating the pattern of the mold in the metal/semiconductor layer that retains most, if not all, of the advantages of the prior art process, while overcoming the afore-mentioned problems.

DISCLOSURE OF INVENTION

In accordance with the embodiments disclosed herein, a method is provided for imprinting a pattern having nanoscale features from a mold into the patternable layer on a substrate. The method comprises:
  providing the mold;
  forming the patternable layer on the substrate; and
  imprinting the mold into the patternable layer;
  wherein the patternable layer comprises a metal or alloy having a transition temperature from its solid form to its liquid form that is within a range of at least 10° above room temperature.

In another embodiment, the method comprises
  providing the mold;
  forming the patternable layer on the substrate, wherein the patternable layer comprises a metal or alloy having a transition temperature from its solid form to its liquid form that is at least 10° C. above room temperature;
  heating the patternable layer to its liquid state;
  imprinting the mold into the patternable layer;
  cooling the patternable layer to its solid state; and
  removing the mold from the patternable layer, leaving a negative copy of the pattern imprinted in the patternable layer.

In yet another embodiment, a masking layer is provided for use in forming a pattern having nanoscale features on the substrate with the mold. The masking layer comprises the patternable layer formed on the substrate. The patternable layer comprises the metal or alloy described above.

BEST MODES FOR CARRYING OUT THE INVENTION

Reference is made now in detail to specific embodiments, which illustrates the best mode presently contemplated by the inventor for practicing the various embodiments. Alternative embodiments are also briefly described as applicable.

Figure 1:
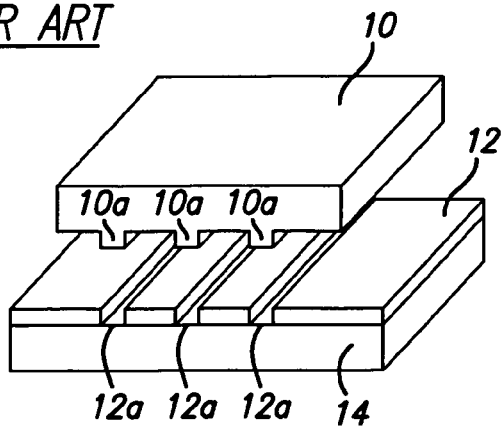
FIG. 1 is a perspective view, depicting a prior art imprinting process.

FIG. 1 is a perspective view, illustrating the imprinting process for a lift-off implementation, wherein a mold 10 with a protruding pattern 10a has been pressed into a thin polymer film 12. The polymer film 12 is supported on a substrate 14.

The protruding pattern 10a in the mold 10 creates a corresponding recess 12a in the thin polymer film 12 during pressing, so the polymer film acquires the reverse of the pattern on the mold. After the mold 10 is removed, the polymer film 12 is processed such that any polymer remaining in the recess area 12a is removed (in the case that the protrusions 10a did not fully contact the surface of the substrate 14), exposing corresponding portions of the underlying substrate 14. On the other hand, in the lift-off implementation, a conductive thin film is deposited from the top direction, and the polymer portion is dissolved in solvent, thereby removing the conductor deposited on the top of the polymer along with the polymer. Thus, only the conductor remaining in the recesses 12a will remain, thereby creating the desired pattern, e.g., conducting wires (not shown).

With further processing, the polymer pattern can be transferred to a metal/semiconductor pattern on the substrate by conventional lift-off and anisotropic etching methods (FIGS. 2 and 3). In these processes, the polymer is used as media to replicate the pattern in the mold, and as mask for etching or lift-off.

Figure 2A:
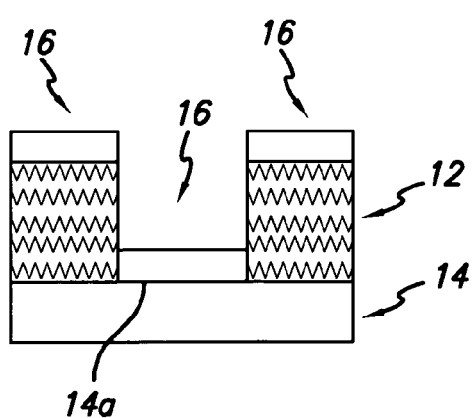
FIGS. 2a–2b, in side elevational view, depict a conventional process for forming a patterned metal layer on a substrate.
Figure 2B:
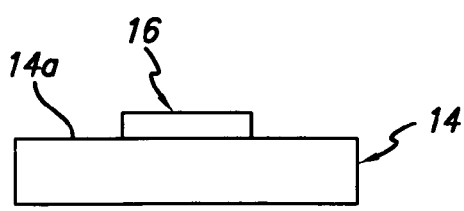
Figure 3A:
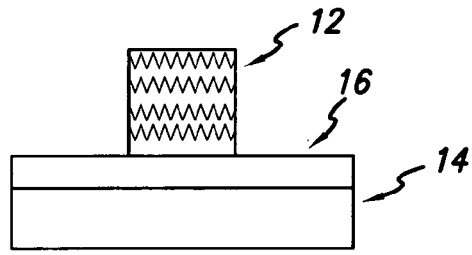
FIGS. 3a–3c, in side elevational view, depict another conventional process for forming a patterned metal on a substrate.
Figure 3B:
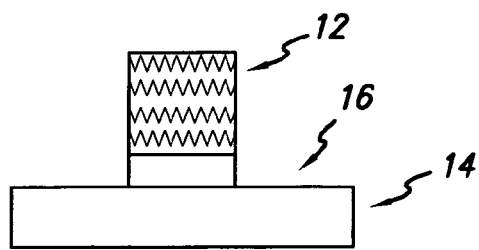

FIGS. 2a–2b and FIGS. 3a–3c are side elevational views, depicting two prior approaches to the well known lift-off process. In FIG. 2a, the patternable polymer layer 12 is formed on the substrate 14. The patternable polymer layer 12 is patterned, as described above, to form openings 12a, one of which is shown in FIG. 2a, that expose the surface 14a of the underlying substrate 14. A metal layer 16 is blanket-deposited everywhere, including on top of the polymer layer 12 and on the exposed portions of the surface 14a. The polymer layer 14 is then removed, such as by etching or dissolution, taking with it the those portions of the metal layer 16 on top of the polymer layer, leaving those portions of the metal layer on the exposed portions of the surface 14a, as shown in FIG. 2b.

In FIG. 3a, the metal layer 16 is deposited on the surface 14a of the substrate. In this approach, the patternable polymer layer 12 is deposited everywhere on the metal layer 16. The patternable polymer layer 12 is then patterned, as described above, leaving portions of the polymer layer covering portions of the underlying metal layer 16, as shown in FIG. 3a. The exposed portions of the metal layer 16 are then removed, such as by etching, leaving the structure depicted in FIG. 3b. Finally, the remaining polymer portions 12 are removed, such as by etching or dissolution, leaving portions of the metal layer 16 on the surface 14a of the substrate 14, as shown in FIG. 3c.

Figure 3C:
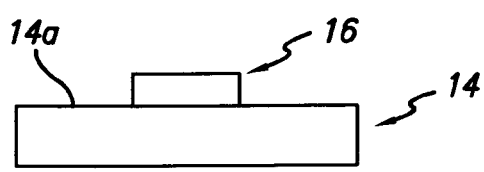

It will be seen that while the two processes described above are different, the final result, depicted in FIGS. 2b and 3c, is the same, namely, patterned metal portions 16 on substrate 14.

When the patterns 10a get close to 10 nm or sub-10 nm scale, however, it is difficult to avoid preventing the polymer 12 from reacting with the mold 10. Therefore, the polymer will stick to the mold, which prevents accurate replication of the pattern in the polymer from the mold.

In accordance with the teachings herein, the transformation between the liquid state and the solid state of metals and alloys is used as the patternable layer in place of the prior art polymer layer. In many instances, the patternable layer disclosed herein also serves as the mold release. Specifically, a method is provided for imprinting a pattern having nanoscale features from a mold into a layer on a substrate. The method comprises:

providing the mold;
forming the patternable layer on the substrate; and
imprinting the mold into the patternable layer;
wherein the patternable layer comprises a metal or alloy having a transition temperature from its solid form to its liquid form that is at least 10° C. above room temperature. As used herein, "room temperature" is defined as being about 20° C.

Figure 5A:
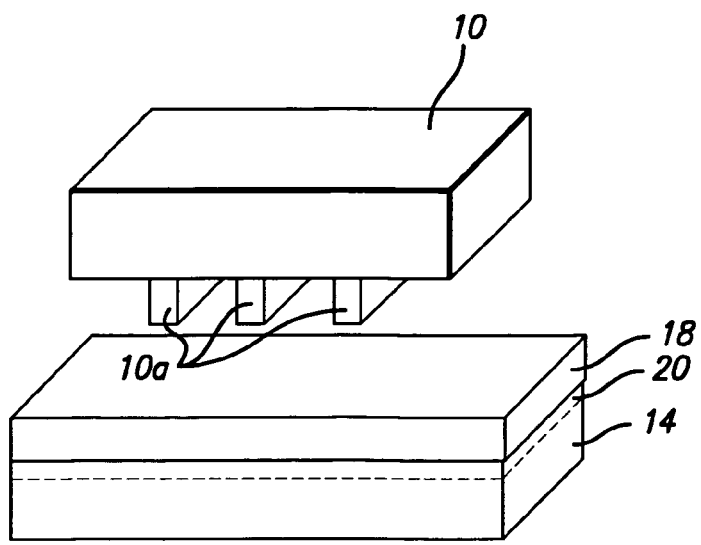
FIGS. 5a–5f, in perspective view, depict an embodiment of the method for imprinting, using a metal (or metal alloy) as the release agent.
Figure 5B:
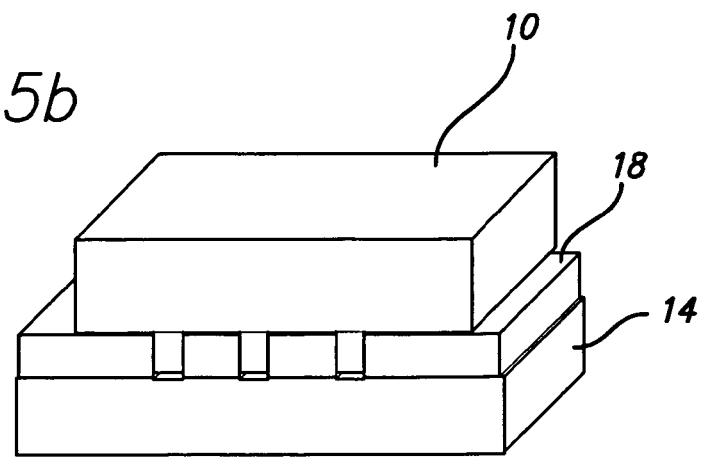
Figure 5C:
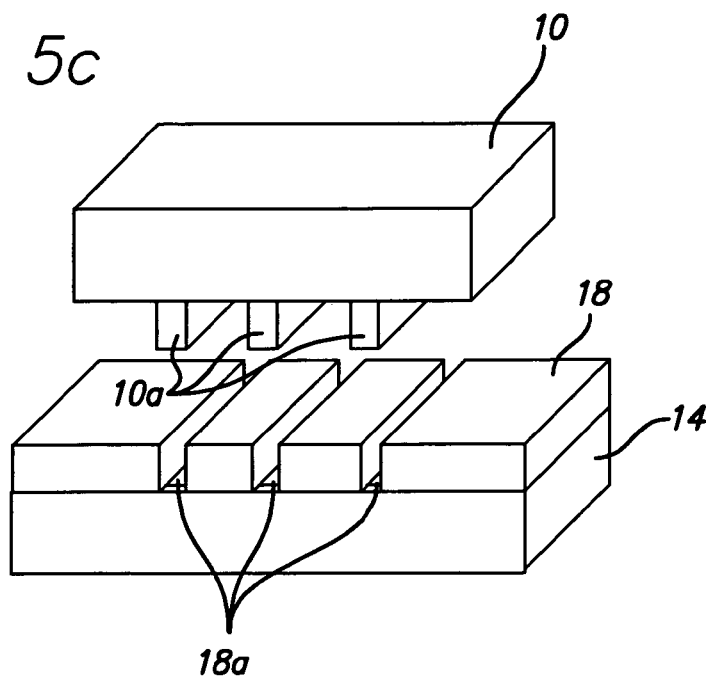
Figure 5D:
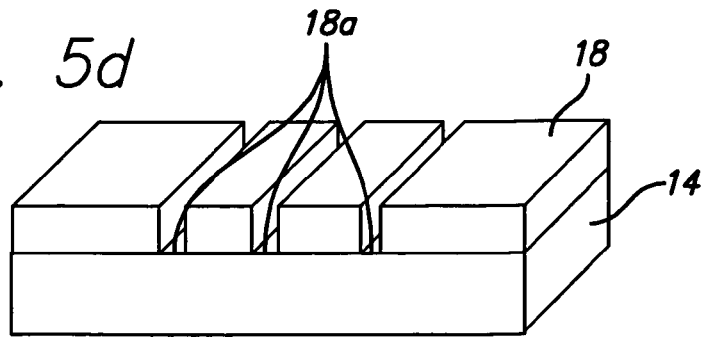
Figure 5E:
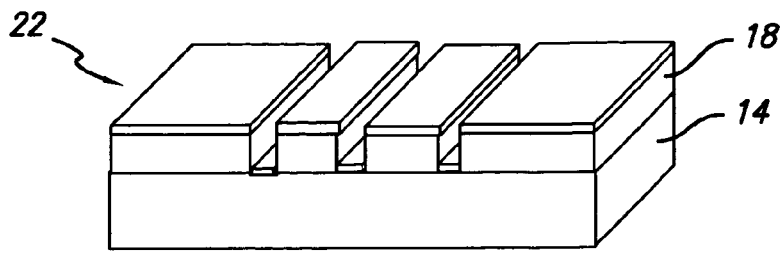
Figure 5F:
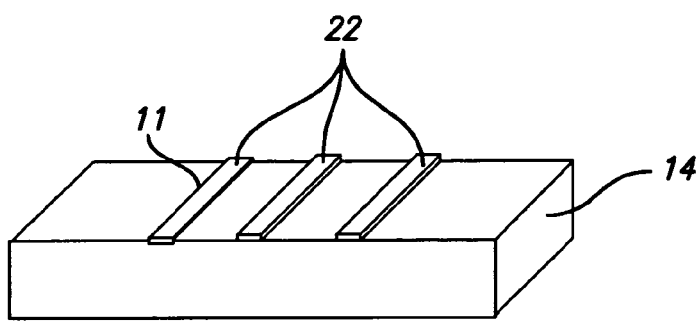
Figure 6:
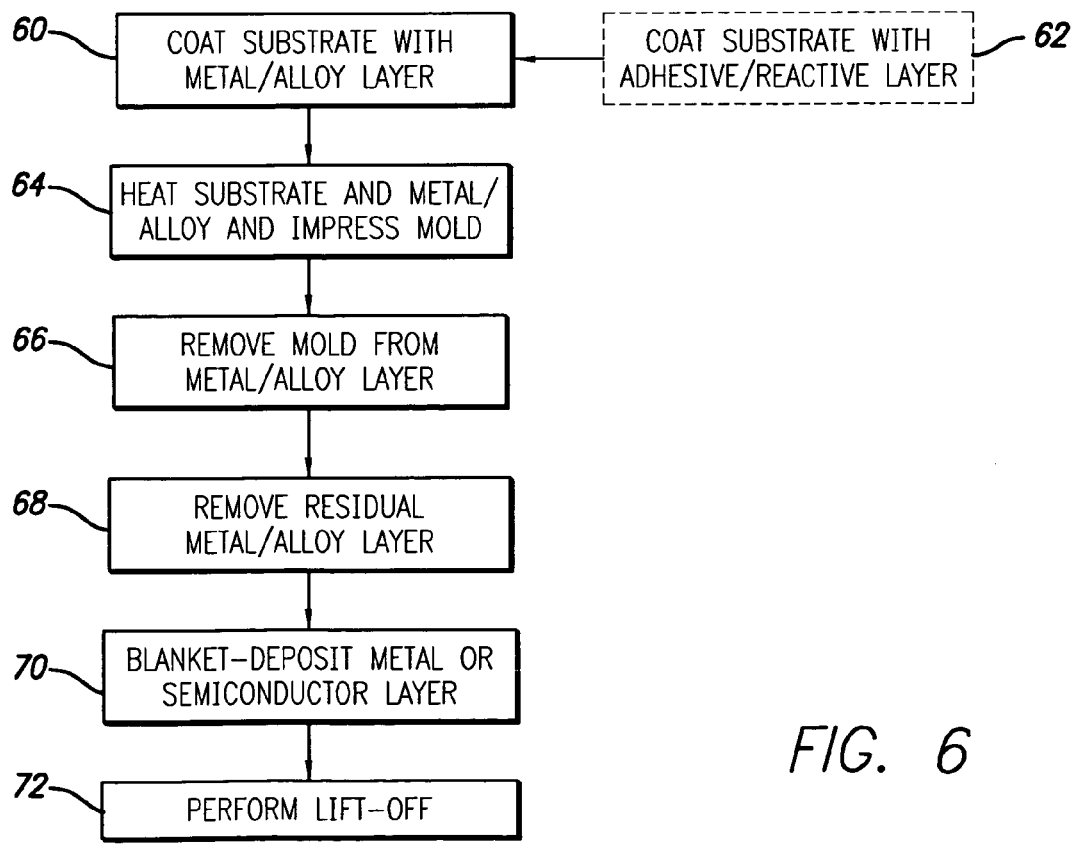
FIG. 6 is a flow chart, depicting an embodiment of the imprinting method.

Referring now to FIGS. 5 and 6, as shown in FIG. 5a, the substrate 14 is coated with a layer 18 of a metal or metal alloy ("metal/alloy") (step 60 in FIG. 6). The metal/alloy layer 18 may comprise any metal or metal alloy having a solid-to-liquid transition temperature of at least 10° C. above room temperature. Preferably, the solid-to-liquid transition temperature is in the range of about 50° to 500° C.

Selection of the composition of the metal/alloy layer 18 is based on its melting point. Preferably, compositions having melting points close to, but somewhat above, room temperature are selected for the imprinting method, since it is easy to perform the imprinting at such mild elevated temperatures and it offers less possibility of damage to other materials or devices during the process. Examples of metals and metal alloys suitably employed in the practice of the embodiments include, but are not limited to, gallium, indium, and tin and their alloys, preferably their binary alloys.

If necessary, an optional adhesive/reactive layer 20 for the metal/alloy is first deposited on the substrate 14 (step 62), followed by deposition of the metal/alloy layer 18 thereon. Such an optional adhesive/reactive layer 20 serves to enhance the adhesivity between the metal/alloy layer 18 and the substrate 14. Examples of such an optional adhesive/reactive layer include, but are not limited to, titanium, chromium, aluminum, platinum, and palladium. The selection of a particular material depends on the composition of the material comprising the mold 10, and one skilled in the art would know which adhesive material to select. As an example, where the mold 10 comprises silicon, silicon dioxide, silicon nitride, sapphire, etc., any of the foregoing listed metals could be used as the optional adhesive/reactive layer 20.

The deposition of the metal/alloy layer 18 (and the optional adhesive/reactive layer 20) is performed using conventional procedures that do not form a part of the embodiments disclosed herein. Examples of such conventional procedures, include, but are not limited to, thermal evaporation and electron-beam evaporation.

The metal/alloy layer 18 is deposited to a thickness within a range of about 1 nanometer (nm) to 1 micrometer (μm), and preferably is within a range of about 1 to 100 nm. The thickness of the optional adhesive/reactive layer 20 is typically less than 5 nm.

The substrate 14 and metal/alloy layer 18 are next heated to transform the metal/alloy to liquid form, and the mold 10 with protruding pattern 10a is impressed toward the substrate (step 64). The liquid metal/alloy layer 18 copies the mold pattern 10a, and the substrate 14 and metal/alloy layer 18 are cooled down to transform the metal/alloy layer back to the solid state, as shown in FIG. 5b.

The mold 10 is removed from the metal/alloy layer 18 (FIG. 5c), leaving recessed portions 18a in the metal/alloy layer (step 66).

The residual metal/alloy 18 in the bottom of the recessed, or trough, areas 18a is removed, such as by anisotropic reactive ion etching or chemical etching, as shown in FIG. 5d (step 68).

A metal or semiconductor layer 22 is next blanket-deposited everywhere, including in the recessed areas 18a, as shown in FIG. 5e (step 70). The composition of the metal or semiconductor layer 22 is different than that of the metal/alloy layer 18. For example, the metal may comprise platinum, palladium, gold, or silver, while the semiconductor may comprise silicon or germanium. The thickness of layer 22 is less than that of layer 18, so the further pattern transfer process will be possible, as discussed below. The thickness range of layer 22 is the same as that of layer 18.

Lift-off is then performed, removing the metal/alloy layer 18 and the portions of the metal/semiconductor layer 22, leaving behind the portions of the metal/semiconductor layer directly on the substrate 14, as shown in FIG. 5f (step 72). Either chemical (wet) etching, such as with an appropriate acid, or reactive ion etching (RIE) may be conveniently used, although any etching technique that performs differential etching between metal/alloy layer 18 and metal/semiconductor layer 22 may be employed.

Alternatively, the metal/alloy layer 18 can also be used as an etching mask layer without lift-off, which has not been described in detail here.

Figure 4A:
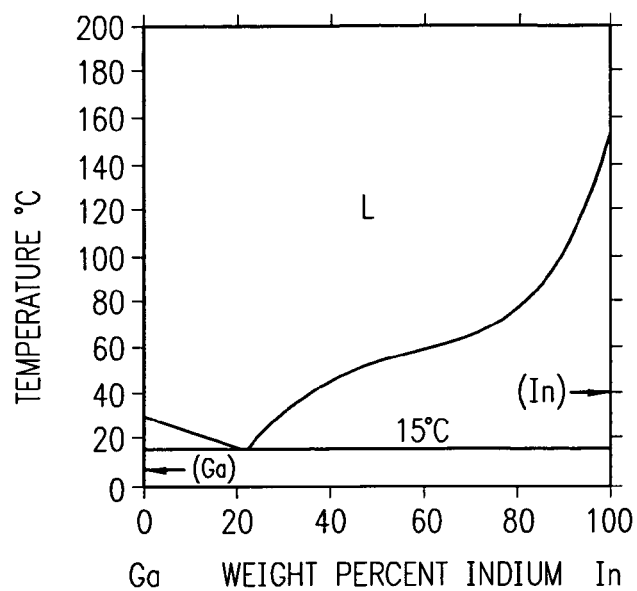
FIGS. 4a–4e, on coordinates of composition and temperature, are known binary phase diagrams of (a) Ga—In, (b) Ga—Sn, (c) In—Sn, (d) Si—Sn, and (e) Si—O.

It is also necessary to choose the composition of the metal/alloy layer 18 such that it is not reactive with the mold 10 but nonetheless adheres to the substrate 14, and permits facile detachment of the mold from the metal/alloy layer after the embossing step. For example, In, Ga, and Sn have melting points of 156.6° C., 29.8° C., and 232° C., respectively, and their alloys have even lower melting points, as shown in FIGS. 4a (Ga—In), 4b (Ga—Sn), and 4c (In—Sn), which are prior art binary phase diagrams. Thus, referring to the melting point of a metal or the solid-liquid transition of a metal alloy, whether binary or higher, is all that is required to select an appropriate metal or metal alloy within the teachings above.

Figure 4B:
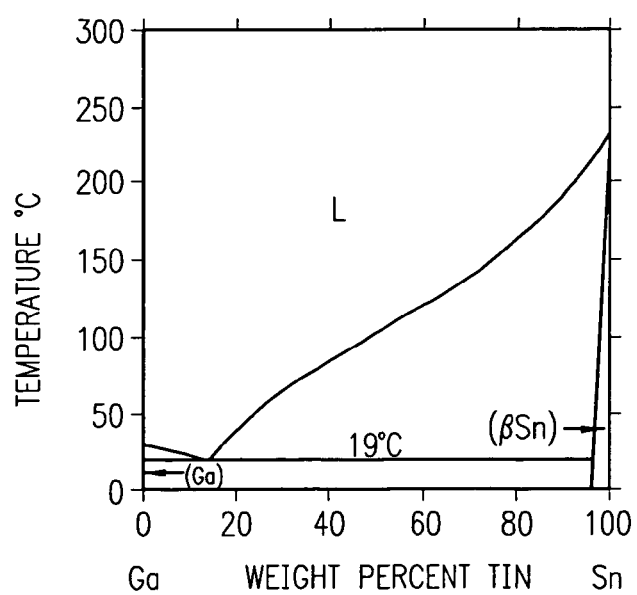
Figure 4C:
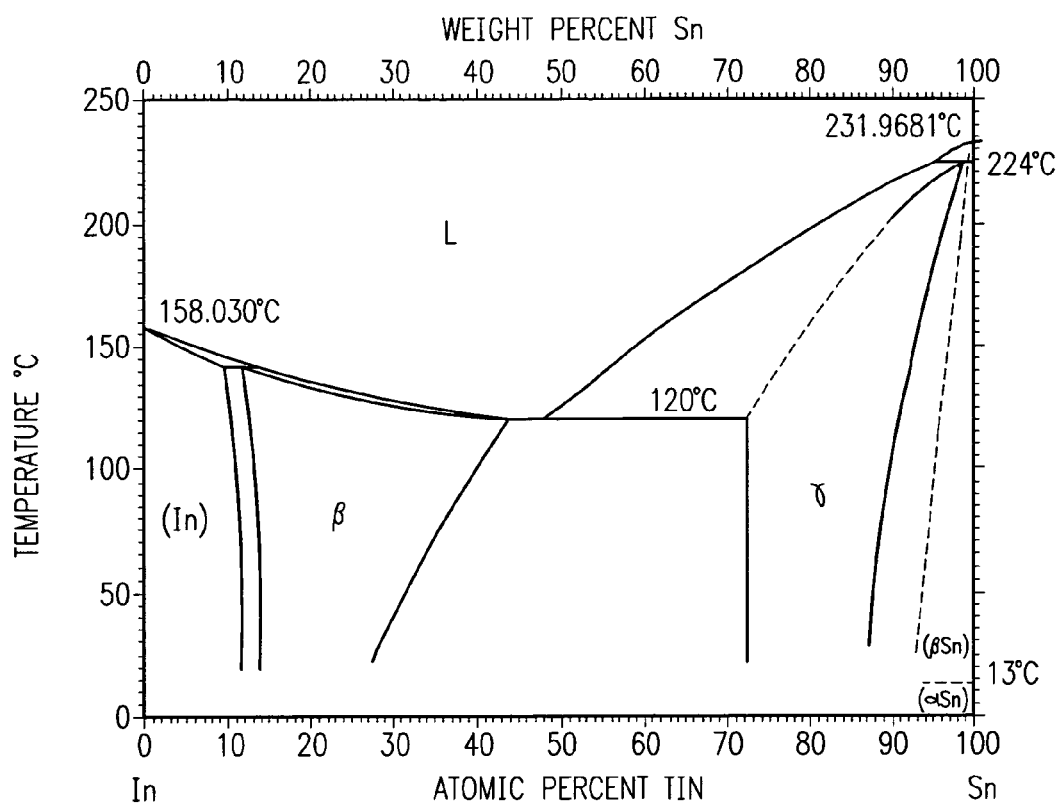
Figure 4D:
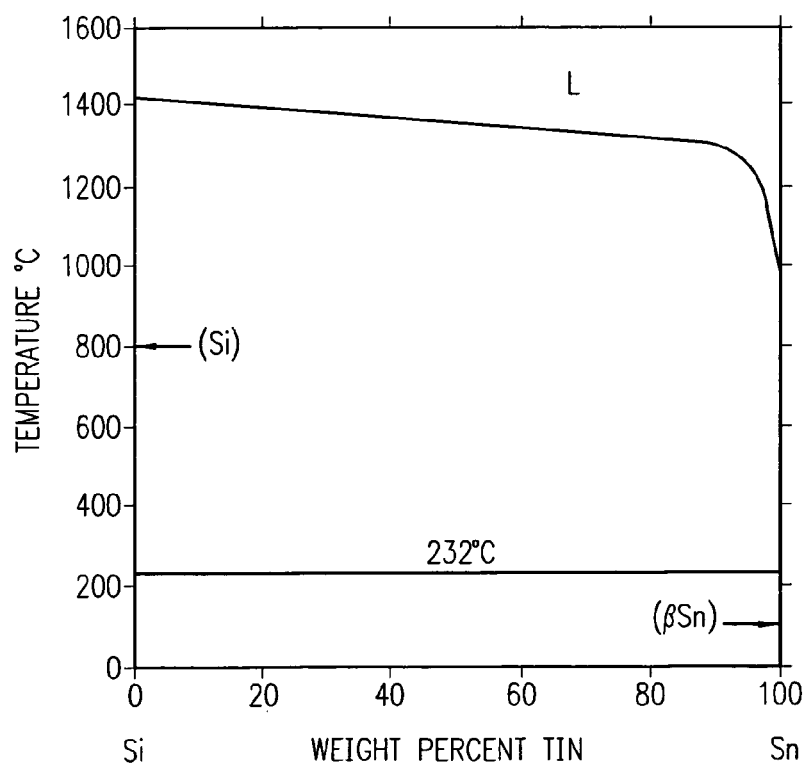

Based on the foregoing, it is easy to move between the solid phase and the liquid phase during the foregoing imprinting process by heating and cooling. If the molds are made of $Si/SiO_2$ materials, then In and Ga and their Sn alloys cannot react with Si at the melting point of the alloy. For example, FIG. 4d depicts the prior art binary phase diagram of the Si—Sn system. It will be seen that the solid-liquid transition is considerably above 500° C., except for a Sn-rich portion (>99% Sn). The binary phase diagrams for Si—Ga and Si—In are similar. Thus, due to the non-reactivity of the metal/alloy layer 18 and the mold 10, the mold should release easily from the metal/alloy layer when it is cooled to its solid phase.

For other kinds of molds, the mold surface can be coated with some non-reactive material, such as a metal, ceramic, or oxide that does not react with the composition of the metal/alloy layer 18, as described above. For example, if In and Ga and their alloys are used for imprinting, Pt, Pd, and Cr can be used as metals to coat the mold 10 to facilitate the release.

Figure 4E:
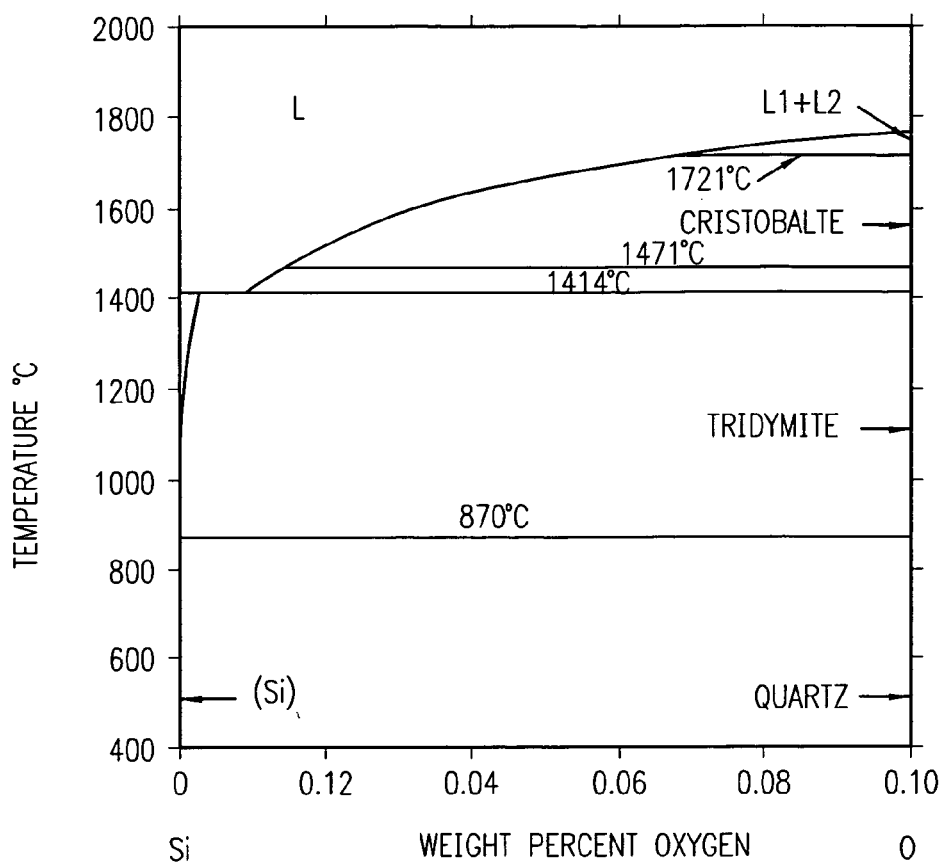

On the other hand, the substrate 14 can be coated with a suitable metal or oxide layer to enhance the adhesion of the metal/alloy layer 18 for imprinting. For example, if $SiO_2$-coated Si is used as substrate 14, and In or Ga or their alloys is used as the imprinting metal/alloy layer 18, then a layer of Sn can be coated on a $SiO_2/Si$ substrate. The Sn can react with $SiO_2/Si$ and be adhered to $SiO_2/Si$ substrate; FIGS. 4d and 4e depict the binary phase diagrams for Si—Sn and Si—O alloys. The In and Ga imprinting metals/alloys layer 24 can also react with Sn to form an alloy; as shown in the above-mentioned binary phase diagrams for In—Sn (FIG. 4c) and Ga—Sn (FIG. 4b), therefore enhancing the adhesion between the imprinting metal/alloy layer 24 and substrate 14.

It will be appreciated that pure Sn can react with the $SiO_2/Si$ substrate, but that Sn alloys, such as Ga—Sn and In—Sn will not.

During the lift-off patterning process, the imprinting metal/alloy layer 18 can be either selectively etched away by chemical methods or heated above its melting point and then removed mechanically.

The metals and alloys will have several advantages over the previous use of polymers for the imprinting process:

(a) The sticking problem between molds and alloy is avoided.
(b) The melting points of the metals and their alloys can be well controlled and adjusted, using phase diagram data.
(c) The solid and liquid phases of metals and alloys can be utilized to advantage, unlike the polymers, which are usually transformed between solid and glassy states. The low viscosity of the metal/alloy liquids permits accurately coping the molds.
(d) The metals and alloys have a much lower molecular weight than the polymer; therefore, they can deform and copy significant smaller patterns than the polymers.
(e) The thickness of the metal/alloy layer 18 can be controlled accurately during the coating process, and the thicknesses of the metal/alloy are very homogeneous over the whole wafer or substrate 14.
(f) The disclosed method is suitable for fabricating high-density nanoscale circuits. By "high density" is meant that the edge-to-edge spacing is considerably less than 100 nm, and even less than 10 nm.
(g) The manufacturing process is simplified by avoiding the relief layer and defects generated during the imprinting processes using polymers.

INDUSTRIAL APPLICABILITY

The use of metals and metal alloys in nanoscale imprinting is expected to find use in a variety of imprinting applications.

What is claimed is:

1. A method of imprinting a pattern having nanoscale features from a mold into a first metal or semiconductor layer on a substrate, said method comprising:
   providing said mold;
   forming a patternable second layer on said substrate, wherein said patternable layer comprises a second metal or alloy having a transition temperature from its solid form to its liquid form that is in the range of 50° to 500° C.; and
   imprinting said mold into said patternable layer to pattern said patternable layer by heating said patternable layer to its liquid form, impressing said mold into said patternable layer, and cooling said patternable layer to its solid form to thereby form a patterned layer;
   transferring said pattern from said patterned layer to said first metal or semiconductor layer by either forming said first metal or semiconductor layer on said substrate subsequent to forming said patterned layer and transferring said pattern by a lift-off process or forming said first metal or semiconductor layer on said substrate prior to forming said patterned layer and transferring said pattern by etching, using said patterned layer as an etching mask layer; and
   removing said patterned layer.

2. The method of claim 1 wherein said patternable layer comprises a metal selected from the group consisting of gallium, indium, and tin and their alloys.

3. The method of claim 2 wherein said alloy comprises a binary alloy of two of said metals.

4. The method of claim 1 wherein said mold comprises a material selected from the group consisting of silicon, silicon dioxide, silicon nitride, and sapphire.

5. The method of claim 1 wherein said substrate comprises a material selected from the group consisting of silicon, silicon dioxide, silicon nitride, and sapphire.

6. The method of claim 1 further forming an adhesive/reactive layer on said substrate and then forming said second metal or metal alloy thereon.

7. The method of claim 6 wherein said adhesive/reactive layer comprises a metal selected from the group consisting of titanium, chromium, platinum, and palladium.

8. A method of imprinting a pattern having nanoscale features from a mold into a first metal or semiconductor layer on a substrates, said method comprising:
- providing said mold;
- forming a patternable second layer on said substrate to form a patterned layer, wherein said patternable layer comprises a second metal or alloy having a transition temperature from its solid form to its liquid form that is in the range of 50° to 500° C.;
- heating said patternable layer to its liquid form;
- impressing said mold into said patternable layer;
- cooling said patternable layer to its solid form, thereby forming said patternable layer; and
- removing said mold from said patternable layer, leaving a negative copy of said pattern imprinted in said patternable layer; and
- removing said patterned layer, leaving said first metal or semiconductor layer,
- wherein either said first metal or semiconductor layer is formed on said substrate subsequent to forming said patterned layer and said pattern is transferred from said patterned layer to said first metal or semiconductor layer by a lift-off process or said first metal or semiconductor layer is formed on said substrate prior to forming said patterned layer and said pattern is transferred to said first metal or semiconductor layer by etching, using said patterned layer as an etching mask layer.

9. The method of claim 8 wherein said patternable layer comprises a metal selected from the group consisting of gallium, indium, and tin and their alloys.

10. The method of claim 9 wherein said alloy comprises a binary alloy of two of said metals.

11. The method of claim 8 wherein said mold comprises a material selected from the group consisting of silicon, silicon dioxide, and sapphire.

12. The method of claim 8 wherein said substrate comprises a material selected from the group consisting of silicon, silicon dioxide, and sapphire.

13. The method of claim 8 further forming an adhesive/reactive layer on said substrate and then forming said second metal or metal alloy thereon.

14. The method of claim 13 wherein said adhesive/reactive layer comprises a metal selected from the group consisting of titanium, chromium, platinum, and palladium.

* * * * *

UNITED STATES PATENT AND TRADEMARK OFFICE
CERTIFICATE OF CORRECTION

| | | |
|---|---|---|
| PATENT NO. | : 7,141,275 B2 | Page 1 of 1 |
| APPLICATION NO. | : 10/870664 | |
| DATED | : November 28, 2006 | |
| INVENTOR(S) | : Yong Chen | |

It is certified that error appears in the above-identified patent and that said Letters Patent is hereby corrected as shown below:

In column 7, line 14, in Claim 8, delete "patternable" and insert -- patterned --, therefor.

In column 7, lines 15-16, in Claim 8, delete "patternable" and insert -- patterned --, therefor.

Signed and Sealed this

Thirtieth Day of March, 2010

David J. Kappos
*Director of the United States Patent and Trademark Office*